US008050100B2

(12) United States Patent
Hanyu et al.

(10) Patent No.: US 8,050,100 B2
(45) Date of Patent: Nov. 1, 2011

(54) NON-VOLATILE SEMICONDUCTOR MEMORY DEVICE WITH A SENSE AMPLIFIER REFERENCE CIRCUIT HAVING A MONOS TRANSFER TRANSISTOR

(75) Inventors: Masami Hanyu, Kanagawa (JP); Junichi Suzuki, Kanagawa (JP); Junichi Yamashita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 111 days.

(21) Appl. No.: 12/697,505

(22) Filed: Feb. 1, 2010

(65) Prior Publication Data
US 2010/0208525 A1  Aug. 19, 2010

(30) Foreign Application Priority Data

Feb. 17, 2009  (JP) ................................. 2009-033673

(51) Int. Cl.
*G11C 16/28* (2006.01)
(52) U.S. Cl. ............ 365/185.21; 365/185.2; 365/185.23
(58) Field of Classification Search ............. 365/185.21, 365/185.2, 185.18, 185.23
See application file for complete search history.

(56) References Cited

U.S. PATENT DOCUMENTS

| | | | | | |
|---|---|---|---|---|---|
| 5,953,275 | A | * | 9/1999 | Sugibayashi et al. | 365/207 |
| 6,038,193 | A | * | 3/2000 | Wang et al. | 365/230.05 |
| 6,094,392 | A | * | 7/2000 | Utsugi et al. | 365/203 |
| 7,590,003 | B2 | * | 9/2009 | Jo et al. | 365/185.17 |
| 2006/0083070 | A1 | | 4/2006 | Arakawa | |

FOREIGN PATENT DOCUMENTS

| JP | 60-167197 A | 8/1985 |
|---|---|---|
| JP | 2006-114154 A | 4/2006 |

\* cited by examiner

*Primary Examiner* — Andrew Q Tran
(74) *Attorney, Agent, or Firm* — Foley & Lardner LLP

(57) ABSTRACT

A non-volatile semiconductor memory device includes a sense amplifier, first and second bit lines that are connected to the sense amplifier, a first memory cell column that is connected to the first bit line, the first memory cell column being formed by a plurality of MONOS type transistors, a first constant current source that is connected to the second bit line, the first constant current source generating a reference current for the first memory cell column, and a first switch that is provided between the first constant current source and the second bit line, the first switch being formed by a MONOS type transistor.

12 Claims, 9 Drawing Sheets

NON-VOLATILE SEMICONDUCTOR MEMORY DEVICE WITH A SENSE AMPLIFIER REFERENCE CIRCUIT HAVING A MONOS TRANSFER TRANSISTOR

INCORPORATION BY REFERENCE

This application is based upon and claims the benefit of priority from Japanese patent application No. 2009-033673, filed on Feb. 17, 2009, the disclosure of which is incorporated herein in its entirety by reference.

BACKGROUND

1. Field of the Invention

The present invention relates to a non-volatile semiconductor memory device.

2. Description of Related Art

In a sense amplifier of a flash memory which is a non-volatile semiconductor memory device, as disclosed in Japanese Unexamined Patent Application Publication No. 2006-114154, for example, current from a target memory cell and current from a reference cell (reference current) are read out through the differential amplification. In this flash memory, a transistor having the same structure as the memory cell is used as a reference cell in order to reduce the influence of power supply voltage fluctuation.

However, according to such a structure, it is needed to set the condition to perform reading/writing from/to each reference cell and to generate reference current. This condition setting process requires a larger amount of time and cost.

Japanese Unexamined Patent Application Publication No. 60-167197 discloses the structure of constantly applying certain voltage to a gate of a MOS transistor which is a reference cell. According to such a structure, there is no need to perform the condition setting stated above. Instead, a switch or a reference cell selection transistor is required to switch a sense amplifier and a reference cell to a conduction state at a predetermined timing.

By the way, in the flash memory, a latch type sense amplifier has been used in various situations in accordance with increased speed of the reading operation, low power consumption, and low voltage operation. The reading operation is performed as follows when such a sense amplifier is applied to Japanese Unexamined Patent Application Publication No. 60-167197.

First, two sense terminals of the sense amplifier are precharged. Next, a read target memory cell and a reference cell selection transistor are activated and sampled at the same time. One sense terminal of the sense amplifier is made conductive to the read target memory cell, and the other sense terminal is made conductive to the reference cell. Hence, charge precharged in each sense terminal is discharged, and a potential difference is generated between both sense terminals. Then, the sense amplifier is activated, which amplifies the potential difference between the both sense terminals.

SUMMARY

However, there is a difference between the read target memory cell and the reference cell selection transistor in terms of capacitance, resistance, current path to the sense amplifier and the like. Thus, there is a problem that there is generated deviation in the timing of discharge in both sense terminals of the sense amplifier after the read target memory cell and the reference cell selection transistor are activated in the above reading operation, which may cause erroneous reading.

An exemplary aspect of the invention is a non-volatile semiconductor memory device including a sense amplifier, first and second bit lines that are connected to the sense amplifier, a first memory cell column that is connected to the first bit line, the first memory cell column being formed by a plurality of MONOS type transistors, a first constant current source that is connected to the second bit line, the first constant current source generating a reference current for the first memory cell column, and a first switch that is provided between the first constant current source and the second bit line, the first switch being formed by a MONOS type transistor.

Both of the first memory cell column and the first switch are formed by MONOS type transistors, whereby it is possible to provide the non-volatile semiconductor memory device with reduced erroneous reading.

According to the present invention, it is possible to provide the non-volatile semiconductor memory device with reduced erroneous reading.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, the specific exemplary embodiments to which the present invention is applied will be described in detail with reference to the drawings. However, the present invention is not limited to the following exemplary embodiments. Further, the following description and drawings are simplified as appropriate for the sake of clarity of illustration.

(First Exemplary Embodiment)

Figure 1:
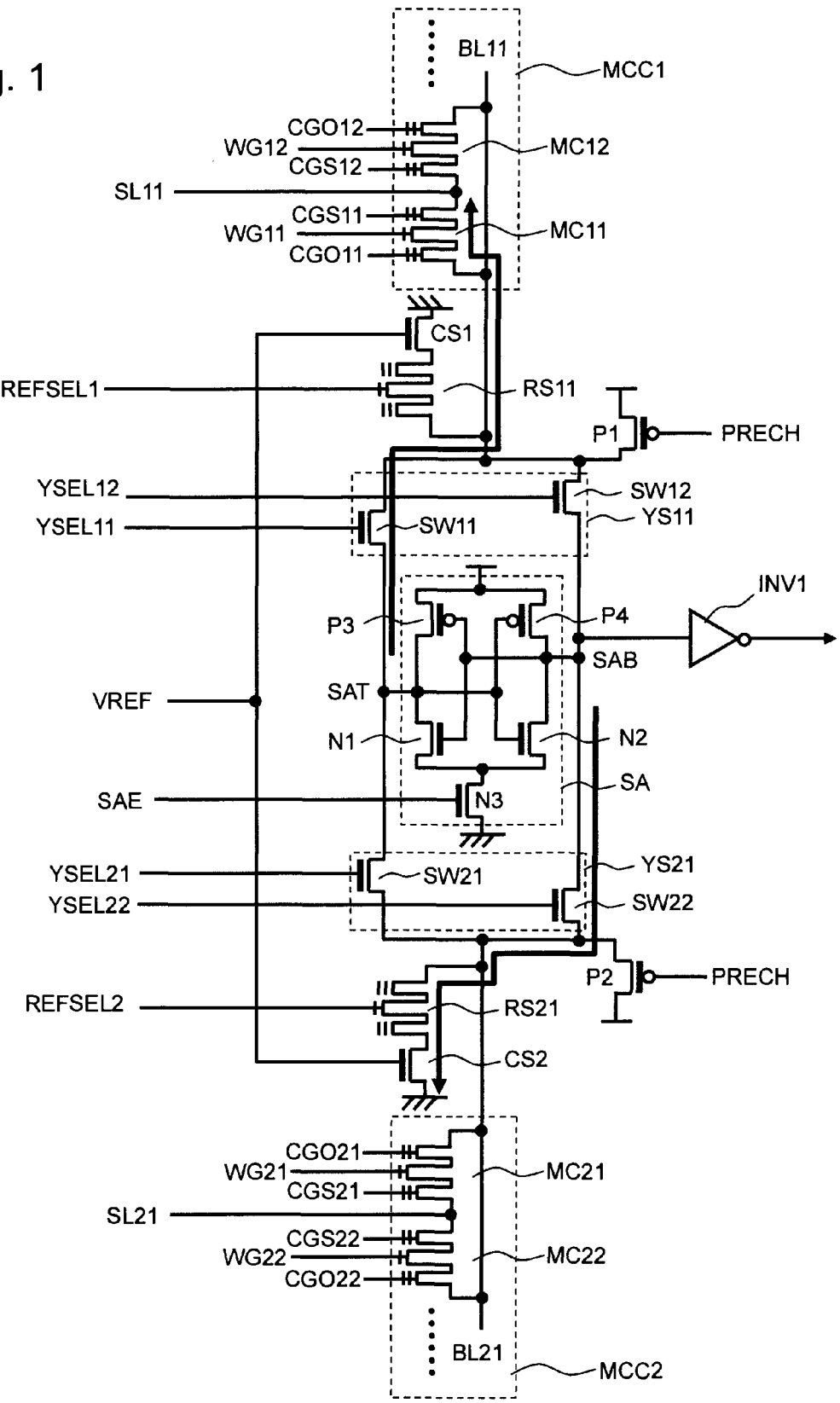
FIG. 1 is a circuit diagram of a non-volatile semiconductor memory device according to a first exemplary embodiment.

FIG. 1 is a circuit diagram of a non-volatile semiconductor memory device according to the first exemplary embodiment of the present invention. This non-volatile semiconductor memory device is a flash memory including a MONOS (Metal Oxide Nitride Oxide Semiconductor) transistor in each memory cell. This non-volatile semiconductor memory device includes a sense amplifier SA, an inverter INV1, a pair of Y selectors YS11, YS21, a pair of precharge transistors P1, P2, a pair of memory cell columns MCC1, MCC2, a pair of reference cell selection transistors RS11, RS21, and a pair of reference cells CS1, CS2. MONOS is also called SONOS (Silicon 1 Oxide Nitride Oxide Semiconductor). In this specification, the term MONOS is used to include both of them and collectively call the structure of a flash memory that includes a charge storage layer.

The sense amplifier SA is a latch type sense amplifier, and includes a pair of inverters. More specifically, one inverter is formed by a P channel MOS (Metal Oxide Semiconductor) transistor P3 and an N channel MOS transistor N1. The other inverter is formed by a P channel MOS transistor P4 and an N channel MOS transistor N2.

Each source of the P channel MOS transistors P3, P4 is connected to a power supply (power supply voltage VDD). A drain of the P channel MOS transistor P3 is connected to a drain of the N channel MOS transistor N1. A gate of the P channel MOS transistor P3 and a gate of the N channel MOS transistor N1 are connected together. A drain of the P channel MOS transistor P4 is connected to a drain of the N channel MOS transistor N2. A gate of the P channel MOS transistor P4 and a gate of the N channel MOS transistor N2 are connected together. Each source of the N channel MOS transistors N1, N2 is connected to a drain of an N channel MOS transistor N3. A source of the N channel MOS transistor N3 is connected to ground.

A node where the drain of the P channel MOS transistor P3 and the drain of the N channel MOS transistor N1 are connected is connected to one sense terminal SAT of the sense amplifier SA. Further, a node where the gate of the P channel MOS transistor P4 and the gate of the N channel MOS transistor N2 are connected together is also connected to a sense terminal SAT. On the other hand, a node where the drain of the P channel MOS transistor P4 and the drain of the N channel MOS transistor N2 are connected is connected to the other sense terminal SAB of the sense amplifier SA. Further, a node where the gate of the P channel MOS transistor P3 and the gate of the N channel MOS transistor N1 are connected together is also connected to the sense terminal SAB.

A gate of the N channel MOS transistor N3 is supplied with a sense amplifier enable signal SAE. As the sense amplifier enable signal SAE becomes High, the sense amplifier SA is activated, and a potential difference between two sense terminals SAT, SAB is amplified. An output signal from the sense amplifier SA is output through the inverter INV1, which is an inverting buffer from the sense terminal SAB.

The Y selector YS11 includes N channel MOS transistors SW11 and SW12 that function as switches. The N channel MOS transistor SW11 is arranged between a bit line BL11 (first bit line) and the sense terminal SAT. On the other hand, the N channel MOS transistor SW12 is arranged between the bit line BL11 and the sense terminal SAB. ON/OFF of the N channel MOS transistors SW11 and SW12 is controlled as selection signals YSEL11 and YSEL12 are input to each gate of the N channel MOS transistors SW11, SW12, respectively.

Similarly, the Y selector YS21 includes N channel MOS transistors SW21 and SW22 that function as switches. The N channel MOS transistor SW21 is arranged between a bit line BL21 (second bit line) and the sense terminal SAT. On the other hand, the N channel MOS transistor SW22 is arranged between the bit line BL21 and the sense terminal SAB. ON/OFF of the N channel MOS transistors SW21, SW22 is controlled as selection signals YSEL21 and YSEL22 are input to each gate of the N channel MOS transistors SW21 and SW22, respectively.

The precharge transistor P1 is a P channel MOS transistor, and functions as a switch for precharging the bit line BL11 to power supply voltage VDD. Further, the precharge transistor P1 is connected to the sense terminal SAT through the N channel MOS transistor SW11 and is connected to the sense terminal SAB through the N channel MOS transistor SW12. ON/OFF of the P channel MOS transistor P1 is controlled as a precharge signal PRECH is input to a gate of the P channel MOS transistor P1.

Similarly, the precharge transistor P2 is also a P channel MOS transistor, and functions as a switch for precharging the bit line BL21 to power supply voltage VDD. Further, the precharge transistor P2 is connected to the sense terminal SAT through the N channel MOS transistor SW21, and is connected to the sense terminal SAB through the N channel MOS transistor SW22. ON/OFF of the P channel MOS transistor P2 is controlled as the precharge signal PRECH is input to a gate of the P channel MOS transistor P2.

The memory cell column MCC1 (first memory cell column) includes a plurality of memory cells that are connected to the bit line BL11. In FIG. 1, only two memory cells MC11 and MC12 are shown for the purpose of simplicity. Each of the memory cells MC11, MC12 is a transistor having twin MONOS structure. The detail of the twin MONOS structure will be described later. Each of the memory cells MC11, MC12 includes one word gate and two control gates. More specifically, as shown in FIG. 1, one control gate of each of the memory cells MC11 and MC12 that are adjacent to each other is connected to a source line SL11 in common. The other control gate of each of the memory cells MC11 and MC12 is connected to the bit line BL11. The structure having a pair of two memory cells MC is repeatedly arranged along the bit line BL11.

Further, a control signal WG11 is input to the word gate of the memory cell MC11, a control signal CGS11 is input to the control gate connected to the source line SL11, and a control signal CGO1 1 is input to the other control gate. Similarly, a control signal WG12 is input to the word gate of the memory cell MC12, a control signal CGS 12 is input to the control gate connected to the source line SL11, and a control signal CGO12 is input to the other control gate.

As is similar to the memory cell column MCC1, the memory cell column MCC2 (second memory cell column) includes a plurality of memory cells connected to the bit line BL21. In FIG. 1, only two memory cells MC21 and MC22 are shown for the purpose of simplicity. One control gate of each of the memory cells MC21 and MC22 that are adjacent to each other is connected to a source line SL21 in common. The other control gate of each of the memory cells MC21 and MC22 is connected to the bit line BL21. The structure having a pair of two memory cells MC is repeatedly arranged along the bit line BL21.

Further, a control signal WG21 is input to the word gate of the memory cell MC21, a control signal CGS21 is input to the control gate connected to the source line SL21, and a control signal CGO21 is input to the other control gate. Similarly, a control signal WG22 is input to the word gate of the memory cell MC22, a control signal CGS22 is input to the control gate connected to the source line SL21, and a control signal CGO22 is input to the other control gate.

The reference cell selection transistors RS11 (second switch) and RS21 (first switch) each includes transistors having twin MONOS structure, as is similar to the memory cells MC. However, by forming a high-concentration impurity layer immediately below the two control gates, the reference cell selection transistors RS11 and RS21 function as switches, as is similar to the normal MOS transistor. The detail of the structure of the reference cell selection transistors RS11, RS21 will be described later.

One control gate side of the reference cell selection transistor RS11 is connected to the bit line BL11. Further, the other control gate side is connected to a drain of the reference cell CS1. ON/OFF of the reference cell selection transistor RS11 is controlled as a selection signal REFSEL1 is input to the word gate.

Similarly, one control gate side of the reference cell selection transistor RS21 is connected to the bit line BL21. Further, the other control gate side is connected to a drain of the reference cell CS2. ON/OFF of the reference cell selection transistor RS21 is controlled as a selection signal REFSEL2 is input to the word gate.

The reference cells CS1 (second constant current source) and CS2 (first constant current source) are N channel MOS transistors. Constant reference voltage VREF is applied to each gate of the reference cells CS1, CS2 in common. In short, the reference cells CS1, CS2 are current source transistors that generate the constant current. The reference cell CS1 functions as a reference cell of the memory cells MC21, MC22 . . . connected to the bit line BL21. On the other hand, the reference cell CS2 functions as a reference cell of the memory cells MC11, MC12 . . . connected to the bit line BL11.

Figure 2:
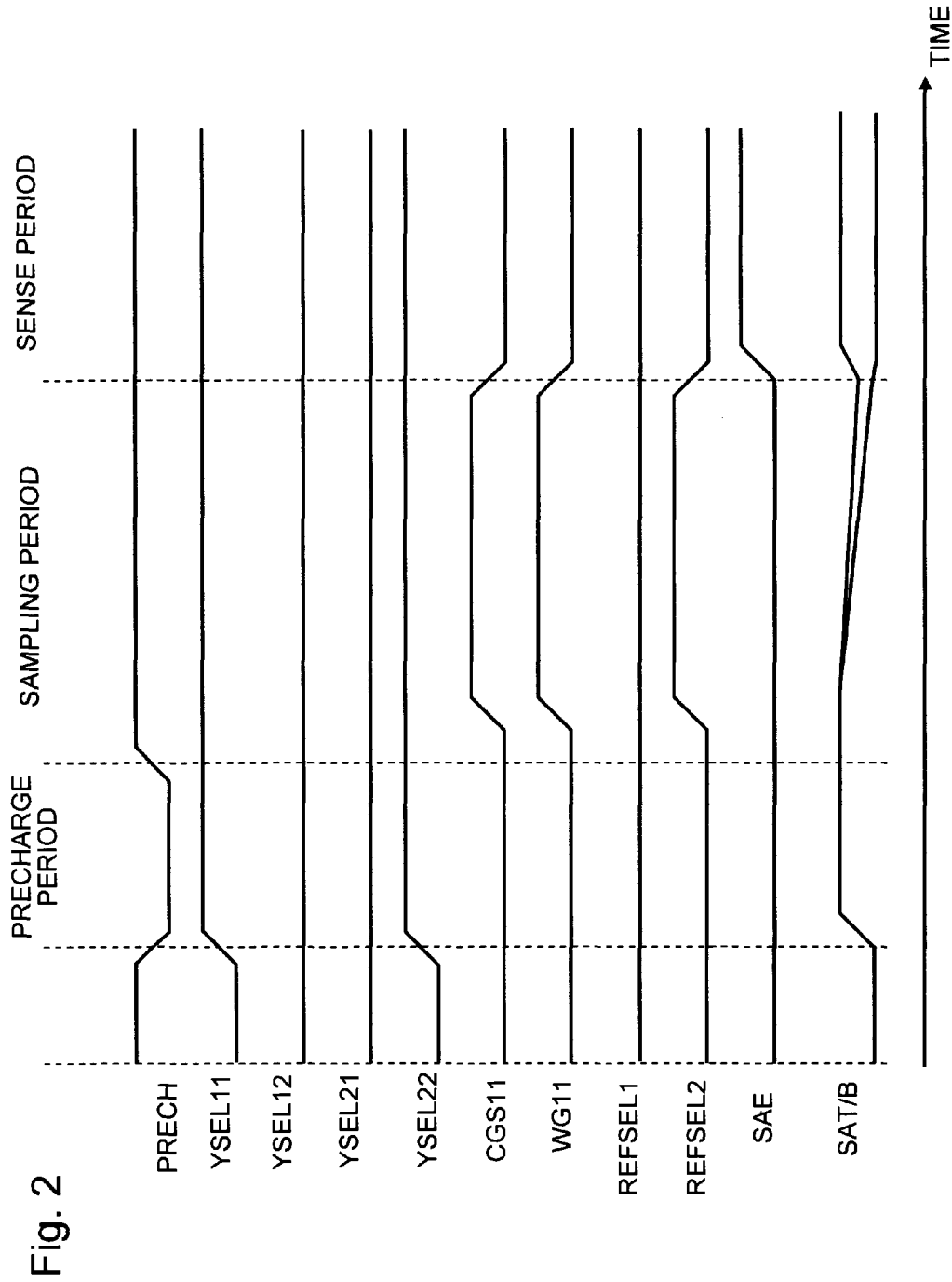
FIG. 2 is a timing chart showing reading operation of the non-volatile semiconductor memory device according to the first exemplary embodiment.

Next, referring to FIG. 2, reading operation of the non-volatile semiconductor memory device according to the first exemplary embodiment will be described. FIG. 2 is a timing chart showing reading operation of the non-volatile semiconductor memory device according to the first exemplary embodiment. Here, reading operation of the memory cell MC11 will be described as an example.

First, the precharge signal PRECH is switched from High to Low, and the selection signals YSEL11 and YSEL22 are switched from Low to High, so that the two sense terminals SAT and SAB of the sense amplifier SA are both charged to power supply potential VDD. More specifically, as the precharge signal PRECH becomes Low, the precharge transistors P1 and P2 that are the P channel MOS transistors are ON. Further, as the selection signals YSEL11 and YSEL22 become High, the N channel MOS transistors SW11 and SW22 are ON. Thus, the two sense terminals SAT and SAB of the sense amplifier SA are both charged to the power supply potential VDD.

Next, the precharge signal PRECH is switched from Low to High, and a precharge period is terminated. Then, the control signals WG11, CGS11 and the selection signal REFSEL2 are switched from Low to High, and discharge is started from the two sense terminals SAT and SAB of the sense amplifier SA. Here, the sense terminal SAT of the sense amplifier SA is made conductive to the read target memory cell MC11, and the sense terminal SAB is made conductive to the reference cell CS2. Thus, the charge precharged to the sense terminals SAT, SAB is discharged, and a potential difference is generated between the sense terminal SAT and the sense terminal SAB. Thick lines in FIG. 1 indicate the discharge paths from the sense terminals SAT, SAB.

Next, the control signals WG11, CGS11 and the selection signal REFSEL2 are switched from High to Low, and a sampling period is terminated. At the same time, the sense amplifier enable signal SAE is switched from Low to High, and moves to a sense period. Here, the sense amplifier SA is activated, and the potential difference between the sense terminal SAT and the sense terminal SAB is amplified.

Note that, as shown in FIG. 2, the selection signals YSEL12, YSEL21, and the selection signal REFSEL1 are kept Low during the period of the reading operation.

Figure 3:
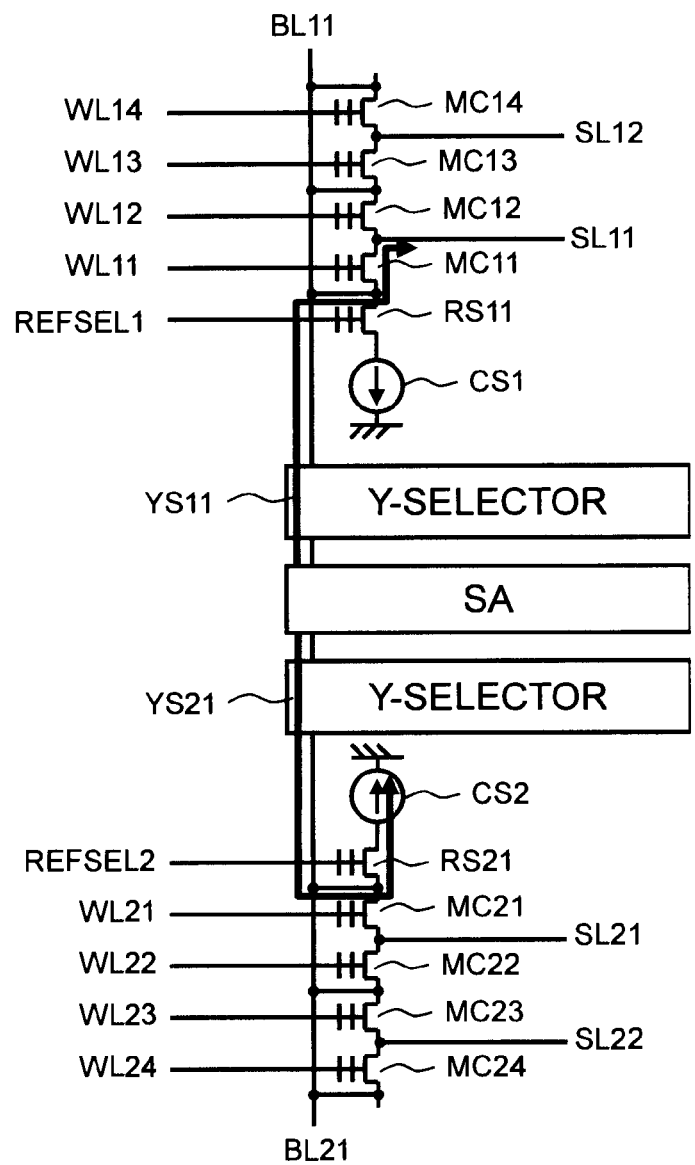
FIG. 3 is a layout diagram of the non-volatile semiconductor memory device according to the first exemplary embodiment.

FIG. 3 is a layout diagram of the non-volatile semiconductor memory device shown in FIG. 1. The components identical to those shown in FIG. 1 are denoted by the same reference symbols. As shown in FIG. 3, in the non-volatile semiconductor memory device according to the first exemplary embodiment, two Y selectors YS11 and YS21 are arranged opposite to each other with the sense amplifier SA interposed therebetween.

The bit line BL11 is connected to the Y selector YS11. Along the bit line BL11, four memory cells MC11 to MC14 connected to each of the word lines WL11 to WL14 are formed. Then, the reference cell selection transistor RS11 is formed in the side of the memory cell column that is the closest to the Y selector YS11 side along the bit line BL11. In summary, the reference cell selection transistor RS11 having the MONOS structure similar to the memory cells MC11 to MC14 is formed to be adjacent to the memory cell MC11.

Similarly, the bit line BL21 is connected to the Y selector YS21. Along the bit line BL21, four memory cells MC21 to MC24 connected to each of the word lines WL21 to WL24 are formed. Then, the reference cell selection transistor RS21 is formed in the side of the memory cell column that is the closest to the Y selector YS21 side along the bit line BL21. In summary, the reference cell selection transistor RS21 having the MONOS structure similar to the memory cells MC21 to MC24 is formed to be adjacent to the memory cell MC21.

Figure 4:
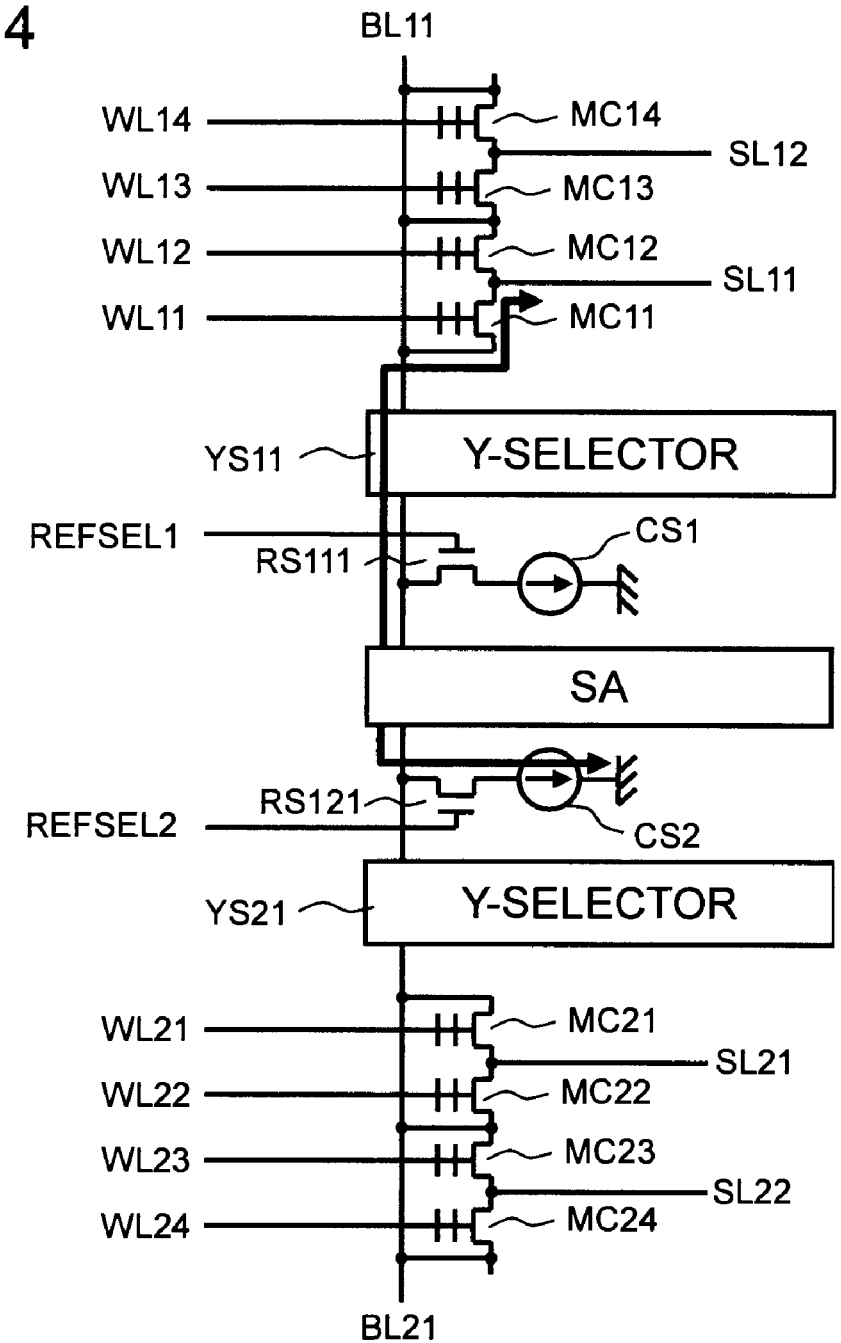
FIG. 4 is a layout diagram of the non-volatile semiconductor memory device according to a comparative example of the first exemplary embodiment.

FIG. 4 is a layout diagram of the non-volatile semiconductor memory device according to a comparative example of the first exemplary embodiment. As shown in FIG. 4, in the comparative example, reference cell selection transistors RS111, RS121 are formed between the sense amplifier SA and the Y selectors YS11, YS21, respectively. Further, the reference cell selection transistors RS111, RS121 are normal N channel MOS transistors. Other structures are similar to those of the non-volatile semiconductor memory device shown in FIG. 3. Note that the reference cells CS 1 and CS2 are drawn as the constant current sources in FIGS. 3 and 4.

Figure 5:
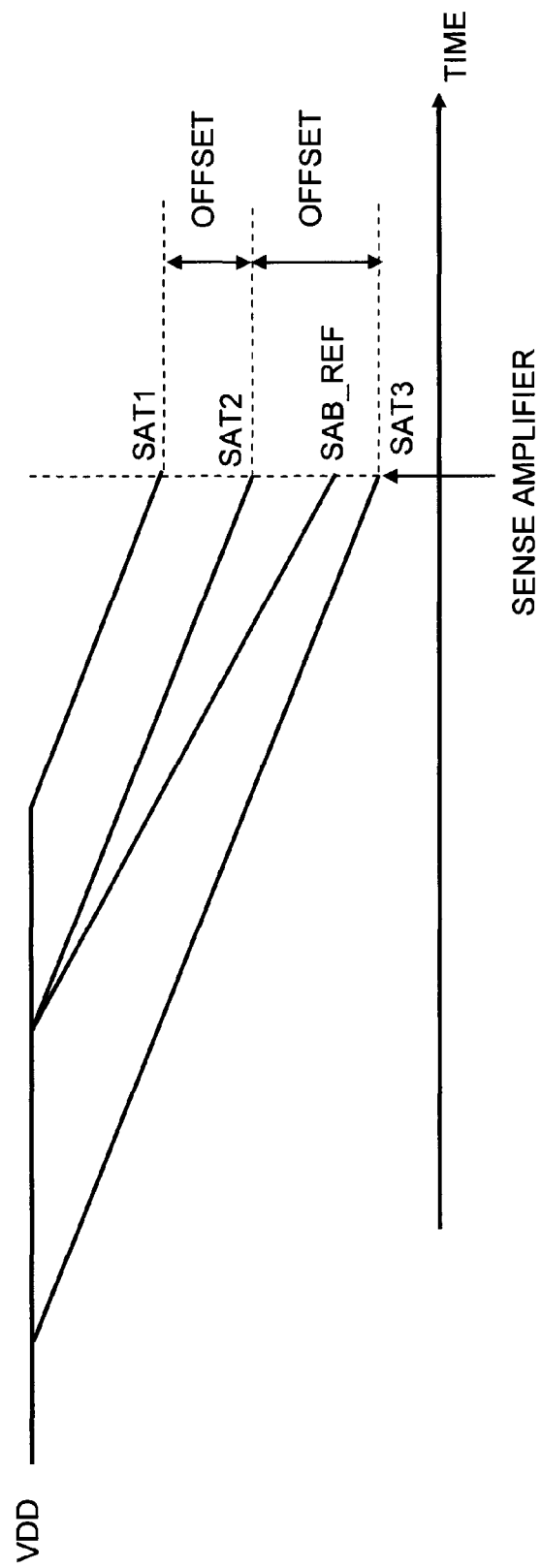
FIG. 5 is a timing chart for describing a problem according to the comparative example.

FIG. 5 is a timing chart for describing the problem according to the comparative example of the first exemplary embodiment. FIG. 5 is an enlarged view of potential change of the sense terminals SAT/B in the sampling period shown at a lowermost stage of FIG. 2. Here, the sense terminal SAT is connected to the memory cell MC11, and the sense terminal SAB is connected to the reference cell CS2. In FIG. 5, the potentials of the sense terminals SAT and SAB are both precharged to the power supply potential VDD at first and both potentials are equal to each other. As time passes, the potentials of the sense terminals SAT and SAB are reduced by discharge.

Now, the discharge of the sense terminal SAT2 and the discharge of the sense terminal SAB_REF are started at the same time, which is an ideal state. On the other hand, there is caused deviation between the timing of discharge of the sense terminals SAT1 and SAT3 and the timing of discharge of the sense terminal SAB_REF. Thus, there is generated offset potential in sense amplifier activation timing compared with the potential of an ideal case. In particular, in case of the sense terminal SAT3, in the sense amplifier activation timing, the potential of the sense terminal SAT3 and the potential of the sense terminal SAB_REF are inverted compared with the ideal state, which causes erroneous reading.

While the discharge current from the sense amplifier SA to the memory cell MC11 flows through the Y selector YS11 in the comparative example shown in FIG. 4, as shown in thick lines, the discharge current from the sense amplifier SA to the reference cell CS2 flows without passing through the Y selector YS21. Further, while the memory cell MC11 has a MONOS structure, the reference cell selection transistor RS121 is a normal MOS transistor. Further, as the power supply or the load is different in the comparative example of FIG. 4, the drive circuit of the reference cell selection transistor RS121 and the word line drive circuit of the memory cell MC11 cannot have the same structure. Thus, deviation is easily caused in the timing of discharge.

On the other hand, in the non-volatile semiconductor memory device according to the first exemplary embodiment shown in FIG. 3, the discharge current from the sense amplifier SA to the memory cell MC11 flows through the Y selector YS11 and the discharge current from the sense amplifier SA to the reference cell CS2 also flows through the Y selector YS21, as shown in thick lines. Further, while the memory cell MC11 has a MONOS structure, the reference cell selection transistor RS21 also has a MONOS structure. Further, the drive circuit of the reference cell selection transistor RS21 and the word line drive circuit of the memory cell MC11 may have the same structure. Accordingly, the deviation of the timing of discharge can be substantially reduced.

Figure 6A:
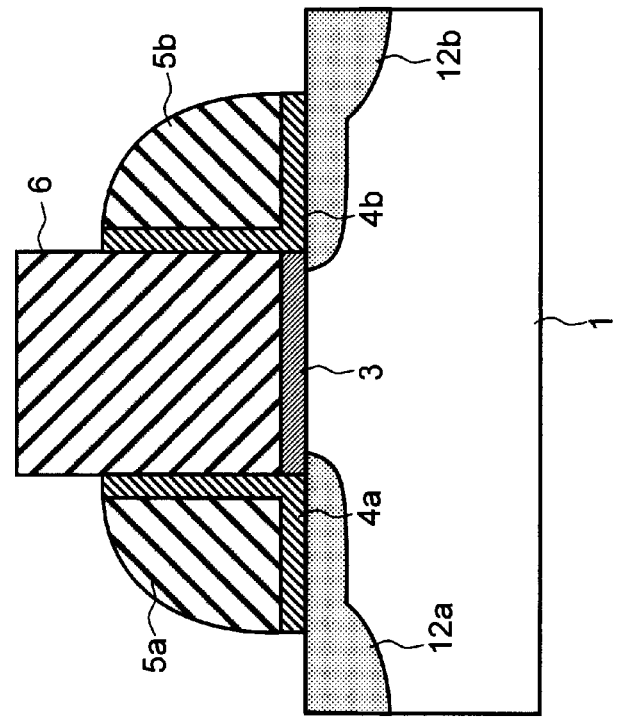
FIG. 6A is a cross sectional view showing the structure of a memory cell according to the first exemplary embodiment.

FIG. 6A is a cross sectional view showing the structure of the memory cells MC11, MC12, MC21, MC22 in FIG. 1. Further, FIG. 6B is a cross sectional view showing the structure of the reference cell selection transistors RS11, RS21 in FIG. 1.

As shown in FIG. 6A, the memory cell MC11 is a transistor having a twin MONOS structure. For example, N$^+$ type high-concentration impurity regions (impurity diffusion regions) 2a, 2b are formed on a substrate 1 formed of silicon, for example, while being apart from each other. An insulation film 3 formed of a silicon oxide film, for example, is formed in a center part between the high-concentration impurity regions 2a, 2b on the substrate 1. On this insulation film 3, a word gate 6 formed of polysilicon, for example, is formed.

Further, a pair of ONO layers 4a and 4b having L-shaped cross sections are formed on the substrate 1 and the side surfaces of the both sides of the word gate 6. The ONO layer has a three-layer structure of oxide film/nitride film/oxide film. Among them, the nitride film functions as the charge storage layer. A pair of control gates 5a and 5b are formed on each of the ONO layers 4a, 4b. In the memory cell 11, the high-concentration impurity regions 2a, 2b are not formed in the substrate 1 below the control gates 5a, 5b.

Figure 6B:
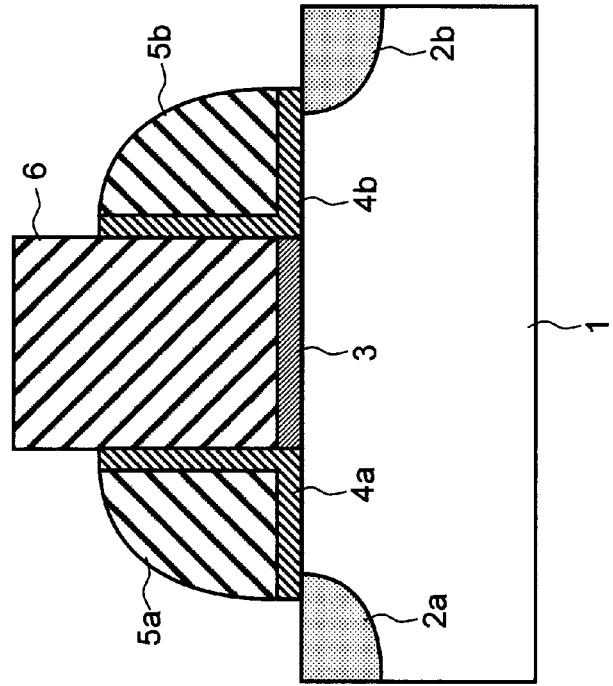
FIG. 6B is a cross sectional view showing the structure of a reference cell selection transistor according to the first exemplary embodiment.

As shown in FIG. 6B, the reference cell selection transistor RS11 has a twin MONOS structure as is similar to the memory cell MC11. However, in the reference cell selection transistor RS11, high-concentration impurity regions 12a, 12b are formed in the substrate 1 below the control gates 5a, 5b. Accordingly, by supplying the control signal only to the word gate 6 not to the two control gates 5a, 5b, the reference cell selection transistor RS11 can be used as the switch as is similar to the normal MOS transistor. Other structures are similar to those of the memory cell MC11, and thus description is omitted. It is preferable that both of the memory cell MC11 and the reference cell selection transistor RS11 have the same design dimensions except for the high-concentration impurity regions. In particular, the widths of the word gates are preferably the same.

(Second Exemplary Embodiment)

Figure 7:
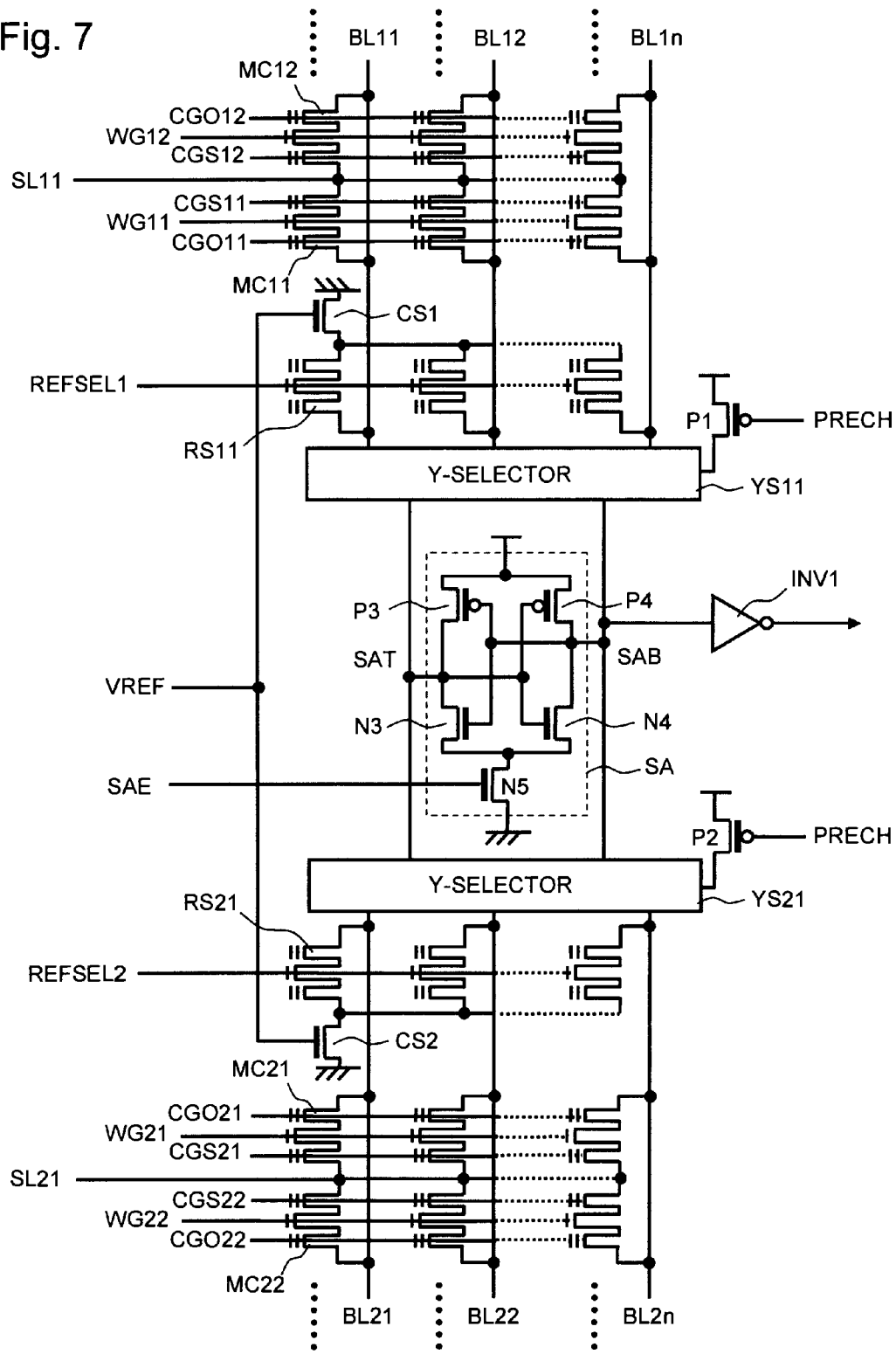
FIG. 7 is a circuit diagram of a non-volatile semiconductor memory device according to a second exemplary embodiment.

Next, the second exemplary embodiment of the present invention will be described with reference to FIG. 7. FIG. 7 is a circuit diagram of a non-volatile semiconductor memory device according to the second exemplary embodiment. The circuit configuration of the non-volatile semiconductor memory device shown in FIG. 7 is different from that shown in FIG. 1 in that a plurality of bit lines are connected to each of the Y selectors YS11, YS21.

More specifically, n bit lines BL11 to BL1n are connected to the Y selector YS11. Here, the reference cell selection transistor RS11, and the memory cells MC11, MC12 are connected to the bit line BL11, as is similar to FIG. 1. Other bit lines BL12 to BL1n also have the same structures. Then, the reference cell selection transistor connected to each of the bit lines BL11 to BL1n is connected to the drain of the reference cell CS1 in common.

Further, n bit lines BL21 to BL2n are connected to the Y selector YS21. Here, the reference cell selection transistor RS21, and the memory cells MC21, MC22 are connected to the bit line BL21, as is similar to FIG. 1. Other bit lines BL22 to BL2n also have the same structures. Then, the reference cell selection transistor connected to each of the bit lines BL21 to BL2n is connected to the drain of the reference cell CS2 in common. Other structures are similar to those shown in FIG. 1, and thus description will be omitted.

Figure 8:
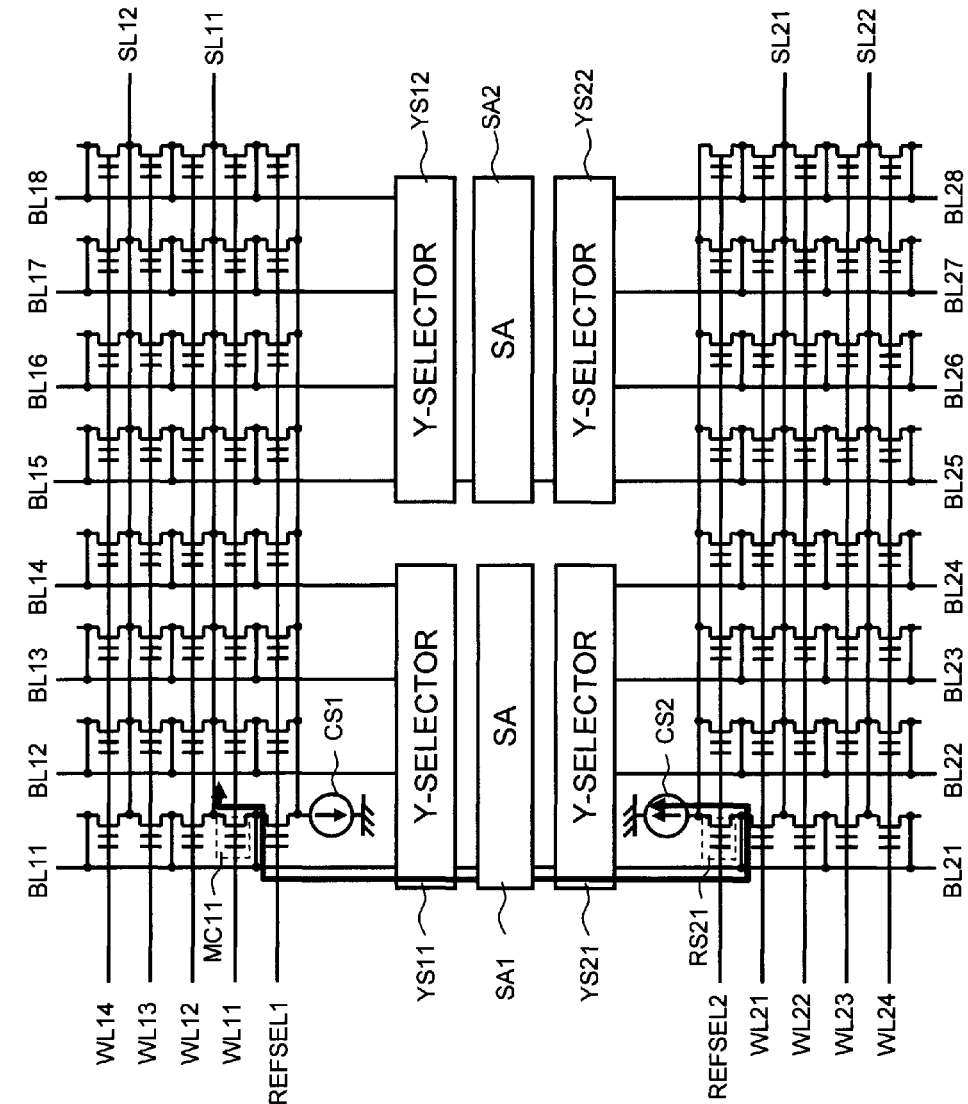
FIG. 8 is a layout diagram of the non-volatile semiconductor memory device according to the second exemplary embodiment.

FIG. 8 is a layout diagram of the non-volatile semiconductor memory device shown in FIG. 7. The components identical to those shown in FIG. 7 are denoted by the same reference symbols. As shown in FIG. 8, in the non-volatile semiconductor memory device according to the second exemplary embodiment, two Y selectors YS11 and YS21 are arranged opposite to each other with the sense amplifier SA1 interposed therebetween. Further, two Y selectors YS12 and YS22 are arranged opposite to each other with the sense amplifier SA2 interposed therebetween.

Four bit lines BL11 to BL14 are connected to the Y selector YS11. Further, four bit lines BL15 to BL18 are connected to the Y selector YS12. Along each of the bit lines BL11 to BL18, four memory cells MC connected to each of the word lines WL11 to WL14 are formed. Then, the reference cell selection transistors RS are formed in the sides of the memory cell columns that are the closest to the Y selectors YS11 and YS12 along each of the bit lines BL11 to BL18. Specifically, eight reference cell selection transistors RS having the MONOS structures similar to the memory cells MC are formed to be adjacent to the eight memory cells MC connected to the word line WL11.

Similarly, four bit lines BL21 to BL24 are connected to the Y selector YS21. Further, four bit lines BL25 to BL28 are connected to the Y selector YS22. Along each of the bit lines BL21 to BL28, four memory cells MC connected to each of the word lines WL21 to WL24 are formed. Then, the reference cell selection transistors RS are formed in the sides of the memory cell columns that are the closest to the Y selectors YS21 and YS22 along each of the bit lines BL21 to BL28. Specifically, eight reference cell selection transistors RS having the MONOS structures similar to the memory cells MC are formed to be adjacent to the eight memory cells MC connected to the word line WL21.

Figure 9:
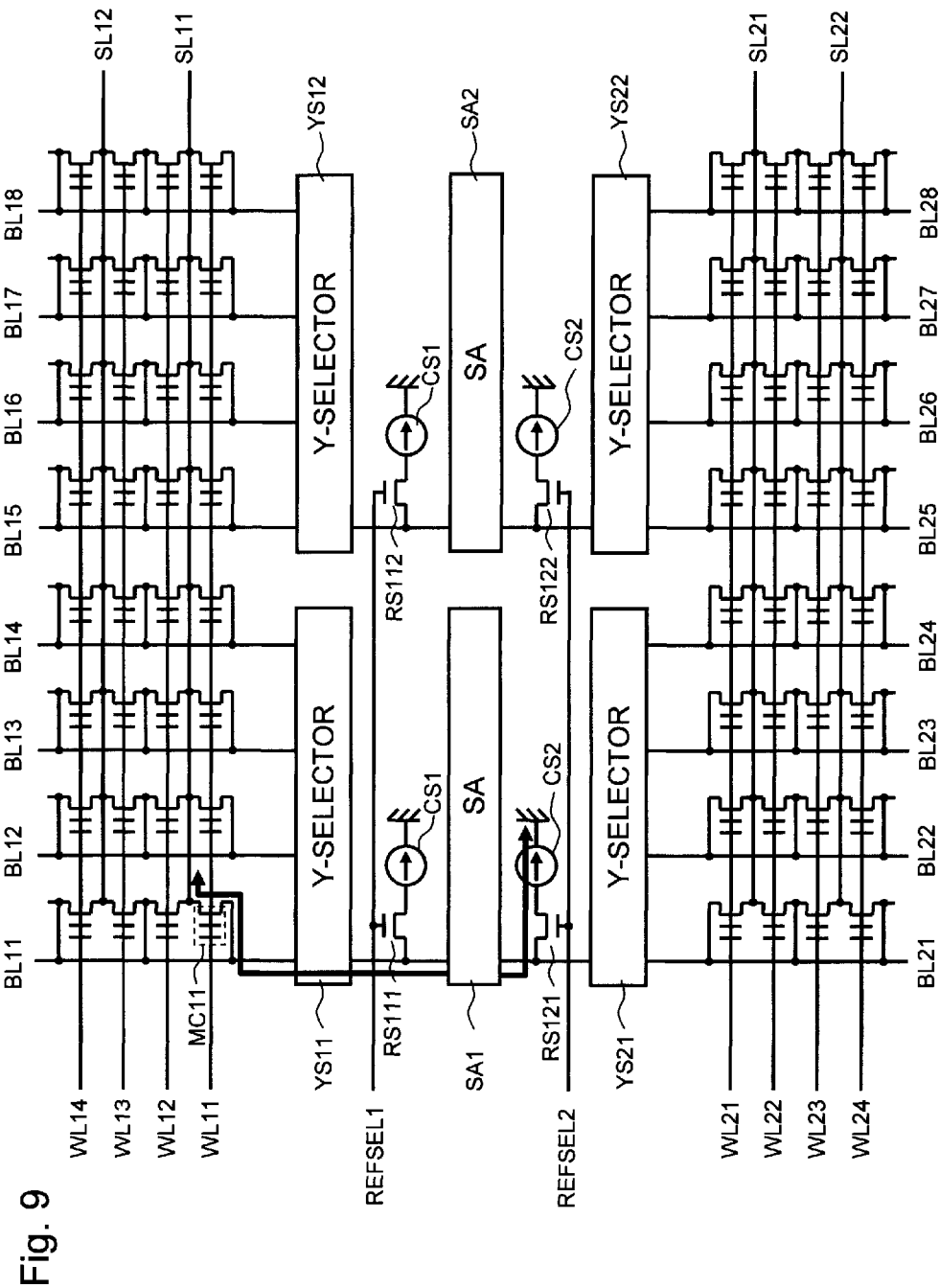
FIG. 9 is a layout diagram of the non-volatile semiconductor memory device according to a comparative example of the second exemplary embodiment.

FIG. 9 is a layout diagram of the non-volatile semiconductor memory device according to a comparative example of the second exemplary embodiment. As shown in FIG. 9, in the comparative example, the reference cell selection transistors RS111, RS121 are formed between the sense amplifier SA1 and the Y selectors YS11, YS21, respectively. Further, the reference cell selection transistors RS112, RS122 are formed between the sense amplifier SA2 and the Y selectors YS12, YS22, respectively. Further, the reference cell selection transistors RS111, RS112, RS121, RS122 are normal N channel MOS transistors. Other structures are similar to those of the non-volatile semiconductor memory device shown in FIG. 8. In FIGS. 8 and 9, the reference cells CS1, CS2 are drawn as the constant current sources.

In the comparative example shown in FIG. 9, as shown by thick lines, the discharge current from the sense amplifier SA to the memory cell MC11 flows through the Y selector YS11, and the discharge current from the sense amplifier SA to the reference cell CS2 flows without passing through the Y selector YS21. Further, while the memory cell MC11 has the MONOS structure, the reference cell selection transistor RS121 is a normal MOS transistor. Further, in the comparative example shown in FIG. 9, as the power supply and the load are different, the drive circuit of the reference cell selection transistor RS121 and the word line drive circuit of the memory cell MC11 cannot be formed with the same configuration. Hence, deviation is easily caused in the timing of discharge.

On the other hand, in the non-volatile semiconductor memory device according to the second exemplary embodiment shown in FIG. 8, as shown by thick lines, the discharge current from the sense amplifier SA to the memory cell MC11 flows through the Y selector YS11, and the discharge current from the sense amplifier SA to the reference cell CS2 flows through the Y selector YS21. Further, while the memory cell MC11 has the MONOS structure, the reference cell selection transistor RS21 also has the MONOS structure. Further, the drive circuit of the reference cell selection transistor RS21 and the word line drive circuit of the memory cell MC11 can have the same configuration. Accordingly, it is possible to substantially reduce the deviation of the timing of discharge stated above.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A non-volatile semiconductor memory device, comprising:
   a sense amplifier;
   first and second bit lines that are connected to the sense amplifier;
   a first memory cell column that is connected to the first bit line, the first memory cell column being formed by a plurality of MONOS type transistors;
   a first constant current source that is connected to the second bit line, the first constant current source generating a reference current for the first memory cell column; and
   a first switch that is provided between the first constant current source and the second bit line, the first switch being formed by a MONOS type transistor.

2. The non-volatile semiconductor memory device according to claim 1, further comprising:
   a second memory cell column that is connected to the second bit line, the second memory cell column being formed by a plurality of MONOS type transistors;
   a second constant current source that is connected to the first bit line, the second constant current source generating a reference current for the second memory cell column; and
   a second switch that is provided between the second constant current source and the first bit line, the second switch being formed by a MONOS type transistor.

3. The non-volatile semiconductor memory device according to claim 2, wherein
   the first switch and the second memory cell column are formed so as to be adjacent to each other, and
   the second switch and the first memory cell column are formed so as to be adjacent to each other.

4. The non-volatile semiconductor memory device according to claim 2, wherein the structure of a circuit that drives the second switch is identical to the structure of a circuit that drives a word line connected to the second memory cell column.

5. The non-volatile semiconductor memory device according to claim 2, wherein each of memory cells that form the first and the second memory cell columns and the first and the second switches is a twin MONOS type transistor that comprises:
   a word gate; and
   two control gates that are arranged opposite to each other with the word gate interposed therebetween.

6. The non-volatile semiconductor memory device according to claim 5, wherein
   an impurity diffusion region is not formed immediately below the two control gates of the memory cells that form the first and the second memory cell columns, and
   an impurity diffusion region is formed immediately below the two control gates of the first and the second switches.

7. The non-volatile semiconductor memory device according to claim 6, wherein in each of the first and the second switches, the word gate is supplied with a control signal, and the two control gates are not supplied with the control signal.

8. The non-volatile semiconductor memory device according to claim 5, wherein widths of the word gates of the memory cells that form the first and the second memory cell columns and widths of the word gates of the first and the second switches have the same design dimensions.

9. The non-volatile semiconductor memory device according to claim 2, further comprising:
   a first selector that connects the first bit line and the sense amplifier; and
   a second selector that connects the second bit line and the sense amplifier.

10. The non-volatile semiconductor memory device according to claim 9, wherein
    the first switch is formed between the second selector and the second memory cell column, and
    the second switch is formed between the first selector and the first memory cell column.

11. The non-volatile semiconductor memory device according to claim 1, wherein the sense amplifier is a latch type sense amplifier.

12. The non-volatile semiconductor memory device according to claim 1, wherein the structure of a circuit that drives the first switch is identical to the structure of a circuit that drives a word line connected to the first memory cell column.

* * * * *